United States Patent
Jin

(10) Patent No.: US 9,629,092 B2
(45) Date of Patent: Apr. 18, 2017

(54) METHOD AND DEVICE FOR REDUCING POWER CONSUMPTION OF MOBILE TERMINAL

(71) Applicant: ZTE CORPORATION, Shenzhen, Guangdong Province (CN)

(72) Inventor: Haibing Jin, Shenzhen (CN)

(73) Assignee: ZTE CORPORATION, Shenzhen, Guangdong Province (CN)

( * ) Notice: Subject to any disclaimer, the term of this patent is extended or adjusted under 35 U.S.C. 154(b) by 0 days.

(21) Appl. No.: 15/036,054

(22) PCT Filed: Feb. 18, 2014

(86) PCT No.: PCT/CN2014/072190
§ 371 (c)(1),
(2) Date: May 11, 2016

(87) PCT Pub. No.: WO2014/135004
PCT Pub. Date: Sep. 12, 2014

(65) Prior Publication Data
US 2016/0286494 A1    Sep. 29, 2016

(30) Foreign Application Priority Data
Nov. 18, 2013 (CN) .......................... 2013 1 0578714

(51) Int. Cl.
H04W 52/52 (2009.01)
H04W 52/02 (2009.01)
H03G 3/30 (2006.01)

(52) U.S. Cl.
CPC ...... *H04W 52/0261* (2013.01); *H03G 3/3026* (2013.01); *H03G 3/3042* (2013.01); *H04W 52/52* (2013.01); *Y02B 60/50* (2013.01)

(58) Field of Classification Search
None
See application file for complete search history.

(56) References Cited

U.S. PATENT DOCUMENTS

2005/0239425 A1    10/2005    Wallace
2006/0017602 A1    1/2006    Puma et al.
(Continued)

FOREIGN PATENT DOCUMENTS

CN        101674441 A    3/2010
CN        102405595 A    4/2012
WO    WO 2010014806 A1    2/2010

OTHER PUBLICATIONS

International Search Report (Form PCT/ISA/210) for International Application No. PCT/CN2014/072190 mailed Jul. 30, 2014.
(Continued)

*Primary Examiner* — Wesley Kim
*Assistant Examiner* — Dong-Chang Shiue
(74) *Attorney, Agent, or Firm* — Koppel, Patrick, Heybl & Philpott

(57) ABSTRACT

Provided is a method and device for reducing the power consumption of a mobile terminal. The method for reducing the power consumption of the mobile terminal includes the following steps: the current transmitting power of the mobile terminal and the current gain switching point of a power amplifier are obtained; when the difference between the obtained current transmitting power and the current gain switching point is less than a preset gain difference, the current gain switching point of the mobile terminal is increased by a first preset value. In the method for reducing the power consumption of the mobile terminal provided by the disclosure, when the difference between the obtained current transmitting power and the current gain switching point is less than the preset gain difference, the current gain switching point of the mobile terminal is increased by the first preset value, so that the low-medium gain working range of the power amplifier of the mobile terminal is extended, and the Power-Added Efficiency (PAE) is
(Continued)

improved, thereby reducing the power consumption of the power amplifier.

8 Claims, 6 Drawing Sheets

(56) References Cited

U.S. PATENT DOCUMENTS

2010/0308909 A1* 12/2010 Verma .................. H03G 3/3042
                                                            330/131
2014/0135054 A1*  5/2014 Chiou .................. H04W 52/146
                                                            455/522

OTHER PUBLICATIONS

Extended European Search Report from European Patent Application No. 14760981.2, dated Oct. 14, 2016.

* cited by examiner

METHOD AND DEVICE FOR REDUCING POWER CONSUMPTION OF MOBILE TERMINAL

TECHNICAL FIELD

The disclosure relates to the technical field of communications, and in particular to a method and device for reducing the power consumption of a mobile terminal.

BACKGROUND

At present, the penetration of smart phones around the world shows a gradual uptrend, meanwhile the smart phone is integrated with more and more functions. Nowadays the smart phone has computer functions, and there is an abundance of applications for it. Also, a large-screen high-definition Liquid Crystal Display (LCD) is increasingly applied to the smart phone. The smart phone implements many functions, but with the large screen and various applications, the biggest problem of designing the smart phone is how to reduce the power consumption of a battery. A large part of power of the mobile phone is consumed in a power amplifier when transmitting a wireless signal via an antenna. So, controlling the power consumption of the power amplifier is an important indicator of reducing the power consumption of a mobile phone battery. However, the power consumption of the power amplifier is fixed according to transmitting power, so how to reduce the power consumption of the power amplifier becomes the present difficult problem.

SUMMARY

The disclosure provides a method and device for reducing power consumption of a mobile terminal, aiming at reducing the power consumption of the mobile terminal.

The disclosure provides a method for reducing power consumption of a mobile terminal, which includes the following steps:

A. current transmitting power of the mobile terminal and a current gain switching point of a power amplifier are obtained; and B. when a difference between the obtained current transmitting power and the current gain switching point is less than a preset gain difference, the current gain switching point of the mobile terminal is increased by a first preset value.

Preferably, after Step B, the method further includes the following step:

C. a communication parameter of the mobile terminal is calculated according to the current gain switching point increased, and when the communication parameter of the mobile terminal does not meet a communication requirement of the mobile terminal, the current gain switching point is decreased by a second preset value.

Preferably, Step C specifically includes the following steps:

C11. when the mobile terminal is at a gain level which is lower than the current gain switching point, and it is figured out, according to the current transmitting power, that the communication parameter of the mobile terminal meets the communication requirement of the mobile terminal currently, the current transmitting power is increased by a third preset value;

C12. the communication parameter of the mobile terminal is calculated according to the current transmitting power increased;

C13. it is judged whether the communication parameter of the mobile terminal meets the communication requirement of the mobile terminal;

C14. if the communication parameter of the mobile terminal does not meet the communication requirement of the mobile terminal, then the current gain switching point is decreased by a second preset value, and Step C12 is continued until the communication parameter of the mobile terminal meets the communication requirement of the mobile terminal;

C15. if the communication parameter of the mobile terminal meets the communication requirement of the mobile terminal, then the current transmitting power is increased by a third preset value while increasing the current gain switching point of the mobile terminal by the first preset value; and C16. when the current transmitting power increased is less than the current gain switching point, Step C12 is continued until the current transmitting power increased is greater than or equal to the current gain switching point.

Preferably, Step C specifically includes the following steps:

C21. when the mobile terminal is at a gain level which is higher than the current gain switching point, and it is figured out, according to the current transmitting power, that the communication parameter of the mobile terminal meets the communication requirement of the mobile terminal currently, the current transmitting power is reduced by a fourth preset value;

C22. the communication parameter of the mobile terminal is calculated according to the current transmitting power reduced;

C23. it is judged whether the communication parameter of the mobile terminal meets the communication requirement of the mobile terminal;

C24. if the communication parameter of the mobile terminal does not meet the communication requirement of the mobile terminal, then the current gain switching point is decreased by a fifth preset value, and Step C22 is continued until the communication parameter of the mobile terminal meets the communication requirement of the mobile terminal;

C25. if the communication parameter of the mobile terminal meets the communication requirement of the mobile terminal, then the current transmitting power is reduced by a fourth preset value while increasing the current gain switching point of the mobile terminal by a first preset value; and C26. when the current transmitting power reduced is greater than the current gain switching point, Step C22 is continued until the current transmitting power reduced is less than or equal to the current gain switching point.

Preferably, after Step A, the method further includes the following step:

D. when the difference between the obtained current transmitting power and the current gain switching point is less than the preset gain difference, and the number of times of adjusting the current transmitting power is less than a preset adjusting threshold, the current gain switching point of the mobile terminal is increased by a first preset value, and Step A is continued until the number of times of adjusting the current transmitting power is greater than or equal to the preset adjusting threshold.

The disclosure also provides a device for reducing power consumption of a mobile terminal, which includes:

an obtaining component configured to obtain current transmitting power of the mobile terminal and a current gain switching point of the power amplifier; and an adjusting component configured to, when the difference between the obtained current transmitting power and the current gain switching point is less than the preset gain difference, increase the current gain switching point of the mobile terminal by a first preset value.

Preferably, the adjusting component is further configured to calculate the communication parameter of the mobile terminal according to the current gain switching point increased, and when the communication parameter of the mobile terminal does not meet the communication requirement of the mobile terminal, decrease the current gain switching point by a second preset value.

Preferably, the adjusting component is specifically configured to, when the mobile terminal is at the gain level which is lower than the current gain switching point, and it is figured out, according to the current transmitting power, that the communication parameter of the mobile terminal meets the communication requirement of the mobile terminal currently, increase the current transmitting power by a third preset value, calculate the communication parameter of the mobile terminal according to the current transmitting power increased, and judge whether the communication parameter of the mobile terminal meets the communication requirement of the mobile terminal; the adjusting component is specifically configured to, if the communication parameter of the mobile terminal does not meet the communication requirement of the mobile terminal, decrease the current gain switching point by a second preset value, and continue to calculate the communication parameter of the mobile terminal according to the current transmitting power increased until the communication parameter of the mobile terminal meets the communication requirement of the mobile terminal, and if the communication parameter of the mobile terminal meets the communication requirement of the mobile terminal, increase the current transmitting power by a third preset value while increasing the current gain switching\ point of the mobile terminal by a first preset value; the adjusting component is specifically configured to, when the current transmitting power increased is less than the current gain switching point, continue to calculate the communication parameter of the mobile terminal according to the current transmitting power increased until the current transmitting power increased is greater than or equal to the current gain switching point.

Preferably, the adjusting component is specifically configured to, when the mobile terminal is at the gain level which is higher than the current gain switching point, and it is figured out, according to the current transmitting power, that the communication parameter of the mobile terminal meets the communication requirement of the mobile terminal currently, reduce the current transmitting power by a fourth preset value, calculate the communication parameter of the mobile terminal according to the current transmitting power reduced, and judge whether the communication parameter of the mobile terminal meets the communication requirement of the mobile terminal; the adjusting component is specifically configured to, if the communication parameter of the mobile terminal does not meet the communication requirement of the mobile terminal, decrease the current gain switching point by a fifth preset value, and calculate the communication parameter of the mobile terminal according to the current transmitting power reduced until the communication parameter of the mobile terminal meets the communication requirement of the mobile terminal, and if the communication parameter of the mobile terminal meets the communication requirement of the mobile terminal, reduce the current transmitting power by a fourth preset value while increasing the current gain switching point of the mobile terminal by a first preset value; the adjusting component is specifically configured to, when the current transmitting power reduced is greater than the current gain switching point, calculate the communication parameter of the mobile terminal according to the current transmitting power reduced until the current transmitting power reduced is less than or equal to the current gain switching point.

Preferably, the device for reducing the power consumption of the mobile terminal further includes:

a counting component, which is configured to count the number of times of adjusting the current gain switching point;

the adjusting component is further configured to, when the number of times of adjusting the current gain switching point is less than the preset adjusting threshold, obtain the current transmitting power of the mobile terminal and the current gain switching point of the power amplifier.

In the method for reducing the power consumption of the mobile terminal provided by the disclosure, when the difference between the obtained current transmitting power and the current gain switching point is less than the preset gain difference, the current gain switching point of the mobile terminal is increased by the first preset value, so that the low-medium gain working range of the power amplifier of the mobile terminal is extended, and the Power-Added Efficiency (PAE) is improved, thereby reducing the power consumption of the power amplifier.

The implementation, function features and advantages of the disclosure are further illustrated in combination with the accompanying drawings and embodiments.

DETAILED DESCRIPTION OF THE EMBODIMENTS

The technical solutions of the disclosure are further illustrated below in combination with the accompanying drawings and embodiments. It should be understood that specific embodiments described here are only used for illustrating the disclosure and not intended to limit the disclosure.

The present embodiment provides a method for reducing power consumption of a mobile terminal.

Figure 1:
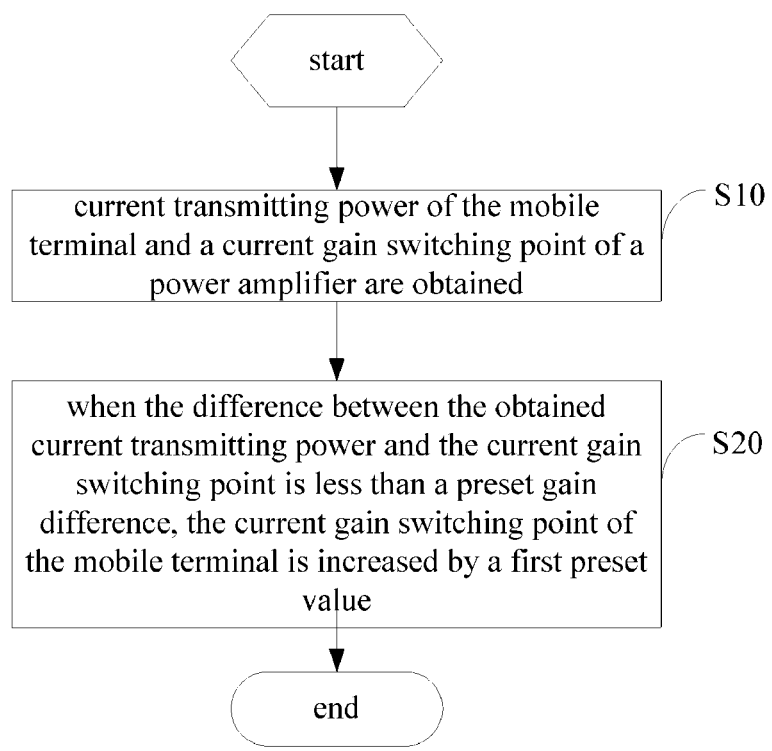
FIG. 1 shows a flowchart of a method for reducing power consumption of a mobile terminal according to a first embodiment of the disclosure.

Refer to FIG. 1, FIG. 1 shows a flowchart of a method for reducing power consumption of a mobile terminal according to a first embodiment of the disclosure.

The disclosure presents the first embodiment of the method for reducing the power consumption of a mobile terminal. In the present embodiment, the method for reducing the power consumption of the mobile terminal includes the following steps.

Step 10: current transmitting power of the mobile terminal and a current gain switching point of a power amplifier are obtained.

The present embodiment is illustrated based on that the mobile terminal is a mobile phone, which is not limited by the disclosure. For the power amplifier of the mobile phone, an illustration is given based on that the power amplifier is set with three levels of gain. A gain interval of each level has a switching point; when the current transmitting power of the mobile terminal is greater than the gain switching point of the first level, the mobile terminal is at the second-level gain.

The calculation formula of the Power Added Efficiency (PAE) of the power amplifier in the mobile phone is as follows:

$$PAE = \frac{P_{out} - P_{in}}{V_{cc} \times I_{cc}} 100\%$$

where $P_{in}$ is input power of the power amplifier in the mobile phone, $P_{out}$ is output power of the power amplifier in the mobile phone, $V_{cc}$ is a power supply voltage of the power amplifier in the mobile phone, and $I_{cc}$ is a consumed current of the power amplifier in the mobile phone.

It can be seen from the above formula that when the input power $P_{in}$ and the output power (i.e. $P_{out}$ the current transmitting power) of the power amplifier and the power supply voltage $V_{cc}$ of the mobile phone are fixed, the higher the PAE, the lower the direct current consumption $I_{cc}$ of the mobile phone, and the lower the power consumption of the power amplifier.

The current power amplifier of the mobile phone is generally set with three levels of gain, wherein the switching point between the first-level gain and the second-level gain is set as R1, and the switching point between the second-level gain and the third-level gain is set as R2. If the current transmitting power of the mobile phone is greater than R1, then the mobile phone is at the second-level gain. The switching points R1 and R2 of the mobile phone in related art are fixed.

For a power amplifier, the PAE of the tail end of the first-level gain is higher than the PAE of the beginning end of the second-level gain by 20%-30% (similarly, the PAE of the tail end of the second-level gain is higher than the PAE of the beginning end of the second-level gain), so, for the mobile phone, when the current transmitting power is close to the switching point R1 between the first-level gain and the second-level gain, if the mobile phone is controlled to use the first-level gain, then the PAE of the mobile phone is improved, that is, the power consumption of the power amplifier is reduced.

Step 20: when the difference between the obtained current transmitting power and the current gain switching point is less than a preset gain difference, the current gain switching point of the mobile terminal is increased by a first preset value.

Specifically, in the present embodiment, the preset gain difference is preferably 1 dBm, and the first preset value is preferably 0.3 dBm. If the difference between the obtained current transmitting power of the mobile terminal and the current gain switching point is less than the preset gain difference, it is indicated that the current transmitting power of the mobile terminal is very close to the current gain switching point of the power amplifier, and then the current gain switching point is adjusted. In addition, note that, an initial gain switching point (namely the current gain switching point) is set before the mobile phone leaves the factory; then, it is decided, according to the environment where the mobile phone is, whether the gain switching point is adjusted.

The present embodiment is illustrated based on that the current transmitting power of the mobile phone is close to the switching point R1 between the first-level gain and the second-level gain.

The current transmitting power of the mobile phone is set as P; there are two cases in the present embodiment.

When R1−1≤P≤R1, it is indicated that the mobile phone is at the first-level gain currently (specifically at the tail end of the first-level gain), at this point, if the current transmitting power of the mobile phone is increased slightly, the mobile phone will be at the second-level gain, and the PAE of the beginning end of the second-level gain is lower than that of the tail end of the first-level gain, so the R1 is increased, for example, it can be increased by 0.3 dBm to ensure that the mobile phone may still be in the first-level gain stably in a short period of time, thereby improving the PAE.

When R1≤P≤R2, it is indicated that the mobile phone is at the second-level gain currently (specifically at the beginning end of the first-level gain), and the PAE of the beginning end of the second-level gain is lower than that of the tail end of the first-level gain, so the R1 is improved to make the mobile phone in the first-level gain, thereby improving the PAE.

In the method for reducing the power consumption of the mobile terminal provided by the present embodiment, when the difference between the obtained current transmitting power and the current gain switching point is less than the preset gain difference, the current gain switching point of the mobile terminal is increased by a first preset value, so that the low-medium gain working range of the power amplifier of the mobile terminal is extended, and the PAE is improved, thereby reducing the power consumption of the power amplifier.

A lot of experimental results show that after the low-medium gain switching point of the power amplifier is dynamically adjusted, the current is saved by at least more than 60 mA compared with the case that the power amplifier uses the fixed switching point. In some cases, especially when the fixed switching point of the power amplifier is set unreasonably, the method presented in the disclosure may save, by setting the reasonable switching point, up to about 100 mA current.

Figure 2:
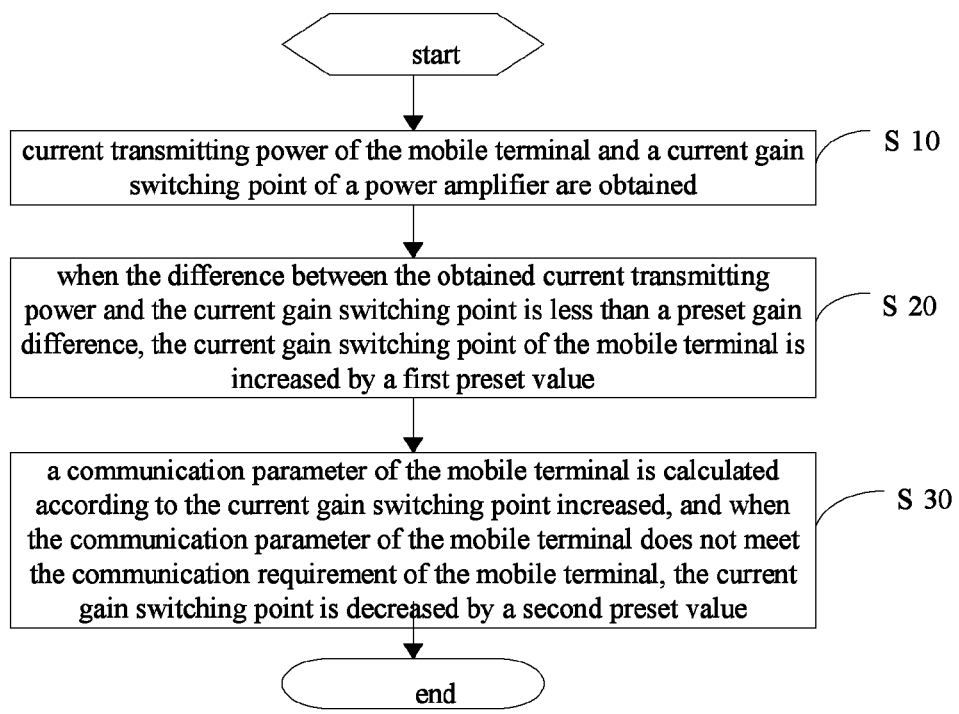
FIG. 2 shows a flowchart of a method for reducing power consumption of a mobile terminal according to a second embodiment of the disclosure.

Refer to FIG. 2, FIG. 2 shows a flowchart of a method for reducing power consumption of a mobile terminal according to a second embodiment of the disclosure.

Based on the above embodiment, the disclosure presents the second embodiment of the method for reducing the power consumption of a mobile terminal. Being different from the above embodiment, after Step 20, the present embodiment further includes the following steps.

Step 30: a communication parameter of the mobile terminal is calculated according to the current gain switching point increased, and when the communication parameter of the mobile terminal does not meet the communication requirement of the mobile terminal, the current gain switching point is decreased by a second preset value.

Because the linearity of the tail end of the first-level gain is poorer than that of the beginning end of the second-level gain, switching performed at the switching point between the first-level gain and the second-level gain may not meet the communication requirement of the mobile terminal. Thus, it is needed to verify the adjusted R1 to judge whether the communication requirement is met. Specifically, in the present embodiment, a specific illustration is given based on that the communication parameters include the Adjacent Channel Leakage Ratio (ACLR) in WCDMA system, or the Adjacent Channel Power Ratio (ACPR) in CDMA system.

After the R1 is increased by 0.3 dBm, it is needed to measure whether the increased R1 is set reasonably, so it is possible to measure whether the ACLR or the ACPR meets the requirement of the 3rd Generation Partnership Project (3GPP), so as to ensure the linearity of the power amplifier after adjusting.

Specifically, when R1−1≤P≤R1, the P is adjusted appropriately to increase the current transmitting power P; for example, the P is first increased by 0.1 dBm (the degree of increasing the P each time is less than the degree of increasing the R1), and then it is measured whether the ACLR or the ACPR at this time meets the requirement of the 3GPP; if the requirement of the 3GPP is met, then the P is increased by 0.1 dBm again, that is, the current transmitting power is adjusted to verify whether the degree of increasing the R1 is reasonable; if it is not reasonable, then the R1 is decreased appropriately, and it is verified again that for the decreased R1, the ACLR or the ACPR corresponding to all transmitting frequencies in the first-level gain should meet the requirement of the 3GPP.

When the mobile terminal adjusts the current gain switching point, there are two cases, one of which is that the mobile terminal is at a gain level which is lower than the current gain switching point, and the other of which is that the mobile terminal is at a gain level which is higher than the current gain switching point.

Figure 3:
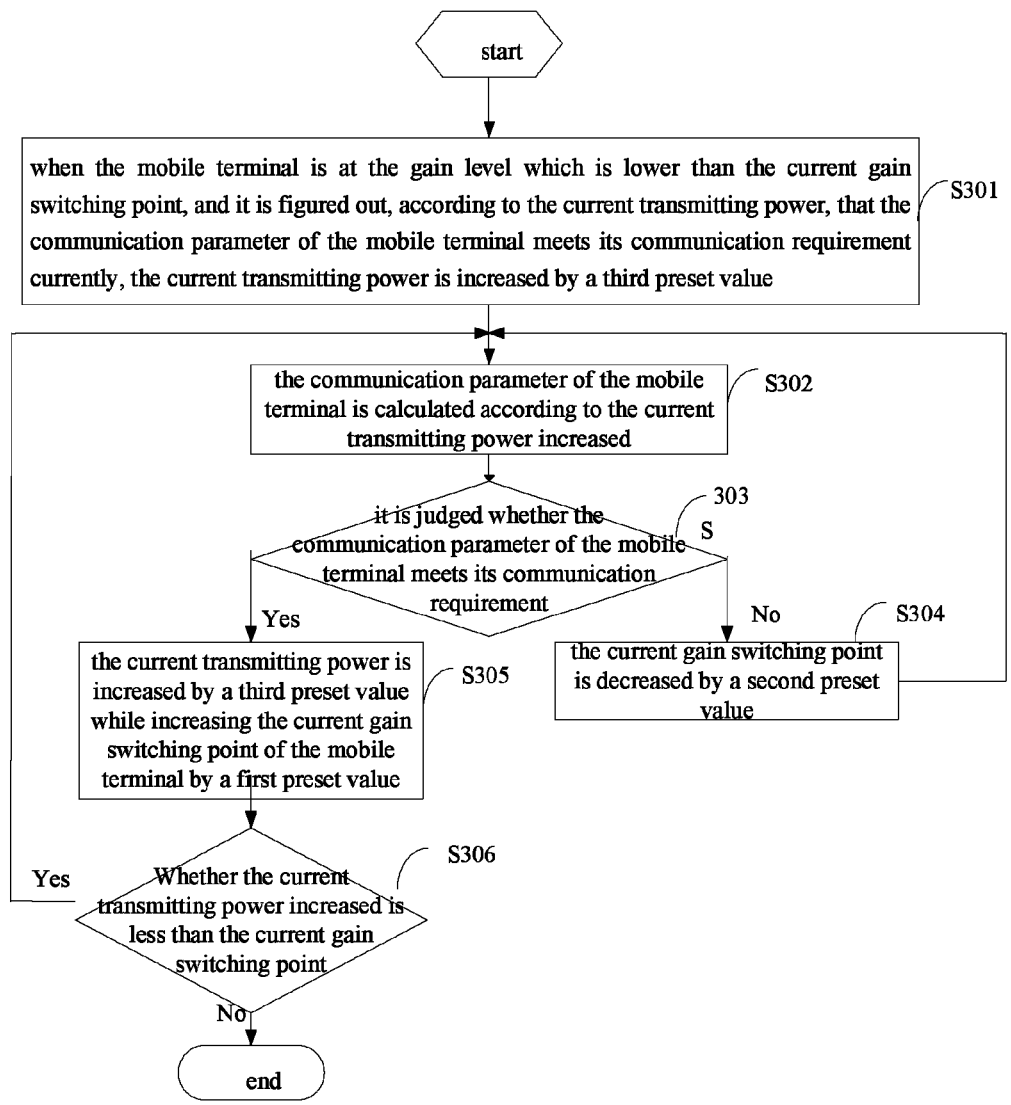
FIG. 3 shows a flowchart of one way of Step 10 shown in FIG. 2.

Specifically, when the mobile terminal is at the gain level which is lower than the current gain switching point, for example, the tail end of the first-level gain, refer to FIG. 3, Step 30 specifically includes the following steps:

Step 301: when the mobile terminal is at the gain level which is lower than the current gain switching point, and it is figured out, according to the current transmitting power, that the communication parameter of the mobile terminal meets the communication requirement of the mobile terminal currently, the current transmitting power is increased by a third preset value;

Step 302: the communication parameter of the mobile terminal is calculated according to the current transmitting power increased;

Step 303: it is judged whether the communication parameter of the mobile terminal meets the communication requirement of the mobile terminal; if the communication parameter of the mobile terminal does not meet the communication requirement of the mobile terminal, then perform Step 304; if the communication parameter of the mobile terminal meets the communication requirement of the mobile terminal, then perform Step 305; go back to Step 302 after performing Step 304; perform Step 306 after performing Step 305;

Step 304: the current gain switching point is decreased by a second preset value;

Step 305: the current transmitting power is increased by a third preset value while increasing the current gain switching point of the mobile terminal by a first preset value; and Step 306: it is judged whether the current transmitting power reduced is less than the current gain switching point; if the current transmitting power increased is less than the current gain switching point, go back to Step 302; if the current transmitting power increased is greater than or equal to the current gain switching point, the flow is ended.

The present embodiment is specifically illustrated based on that the second preset value is 0.2 dBm, and the third preset value is 0.5 dBm.

If the mobile terminal is at the gain level which is lower than the current gain switching point, the R1 is the current gain switching point, and the mobile terminal is at the first-level gain, first the ACLR or the ACPR is calculated according to the current transmitting power P; if the ACLR or the ACPR meets the requirement of the 3GPP, the current gain switching point R1 is adjusted to be increased by 0.3 dBm while increasing the current transmitting power by 0.5 dBm as the step size; note that, during adjusting, it is required that the R1 is greater than the P, or else, the loop is stopped, and the current gain switching point and the current transmitting power are not increased. After the current gain switching point is adjusted, it is needed to determine whether the current gain switching point adjusted is appropriate, at this point, the ACLR and the ACPR are calculated according to the updated current transmitting power P; if the ACLR or the ACPR does not meet the requirement of the 3GPP, it is indicated that the current gain switching point is set too high, then the current gain switching point R1 is decreased by 0.2 dBm as the step size; after decreasing, it is needed to judge again whether the ACLR or the ACPR meets the requirement of the 3GPP, so as to determine whether the current gain switching point reduced is appropriate; if the ACLR or the ACPR does not meet the requirement of the 3GPP, the current gain switching point R1 is decreased again by 0.2 dBm as the step size until the ACLR or the ACPR meets the requirement of the 3GPP.

Figure 4:
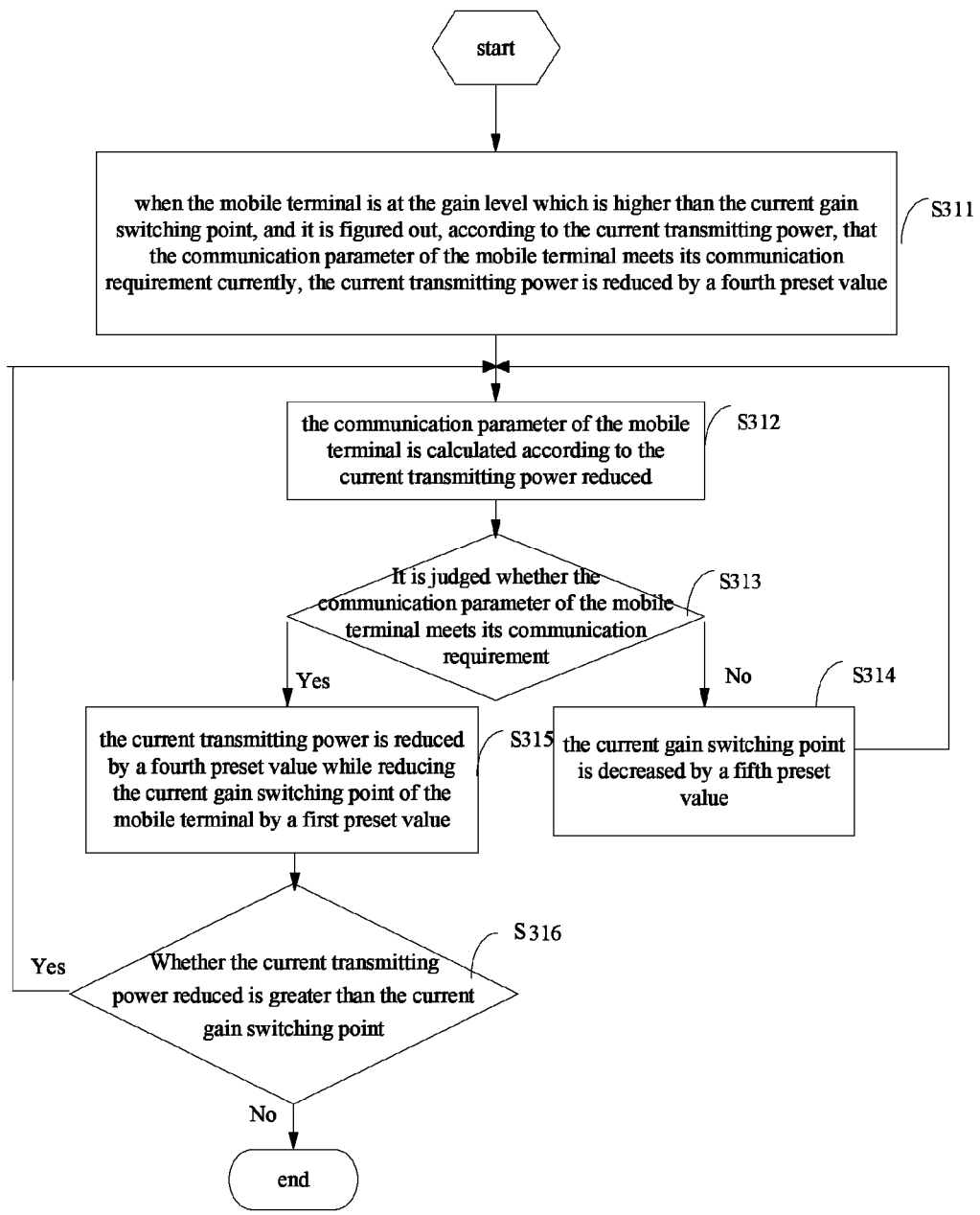
FIG. 4 shows a flowchart of the other way of Step 10 shown in FIG. 2.

Specifically, when the mobile terminal is at the gain level which is higher than the current gain switching point, for example, the beginning end of the second-level gain, refer to FIG. 4, Step 30 specifically includes the following steps:

Step 311: when the mobile terminal is at the gain level which is higher than the current gain switching point, and it is figured out, according to the current transmitting power, that the communication parameter of the mobile terminal meets the communication requirement of the mobile terminal currently, the current transmitting power is reduced by a fourth preset value;

Step 312: the communication parameter of the mobile terminal is calculated according to the current transmitting power reduced;

Step 313: it is judged whether the communication parameter of the mobile terminal meets the communication requirement of the mobile terminal; if the communication parameter of the mobile terminal does not meet the communication requirement of the mobile terminal, then perform Step 314; if the communication parameter of the mobile terminal meets the communication requirement of the mobile terminal, then perform Step 315; go back to Step 312 after performing Step 314; perform Step 316 after performing Step 315;

Step 314: the current gain switching point is decreased by a fifth preset value;

Step 315: the current transmitting power is reduced by a fourth preset value while reducing the current gain switching point of the mobile terminal by a first preset value; and Step 316: it is judged whether the current transmitting power reduced is greater than the current gain switching point; if the current transmitting power reduced is greater than the current gain switching point, go back to Step 302; if the current transmitting power reduced is less than or equal to the current gain switching point, the flow is ended.

The present embodiment is specifically illustrated based on that the fourth preset value is 0.5 dBm, and the fifth preset value is 0.2 dBm.

If the mobile terminal is at the gain level which is higher than the current gain switching point R1, and R1<P<R1+1 dBm, it is indicated that the mobile terminal is at the beginning end of the second-level gain, at this point, the ACLR or the ACPR is calculated according to the current transmitting power P; if the ACLR or the ACPR meets the requirement of the 3GPP, the current gain switching point R1 is adjusted to be increased by 0.3 dBm while reducing the current transmitting power by 0.5 dBm as the step size; note that, during adjusting, it is required that the R1 is less than the P, or else, the loop is stopped. After the current gain switching point is adjusted, it is needed to determine whether the current gain switching point adjusted is appropriate, at this point, the ACLR and the ACPR are calculated according to the updated current transmitting power P; if the ACLR or the ACPR does not meet the requirement of the 3GPP, it is indicated that the current gain switching point is set too high, then the current gain switching point R1 is decreased by 0.2 dBm as the step size; after decreasing, it is judged again whether the ACLR or the ACPR meets the requirement of the 3GPP, so as to determine whether the current gain switching point R1 reduced is appropriate; if the ACLR or the ACPR does not meet the requirement of the 3GPP, the current gain switching point R1 is decreased again by 0.2 dBm as the step size until the ACLR or the ACPR meets the requirement of the 3GPP.

In addition, note that, the process of determining the current gain switching point R2 between the second-level gain and the third-level gain is similar to the process of determining the R1, but in the process of determining the current gain switching point R2 between the second-level gain and the third-level gain, because the transmitting frequency of the mobile terminal at this time is at a higher value, and the ACLR or the ACPR changes strongly, so the adjusting process is finer, and the step size of adjusting the R1 and the P is small compared with the adjustment of the R1.

In the method for reducing the power consumption of the mobile terminal provided by the present embodiment, when the communication parameter of the mobile terminal does not meet the communication requirement of the mobile terminal, the current gain switching point is decreased by a second preset value, so that it is ensured that the degree of adjusting the gain switching point is appropriate to meet the communication requirement of the mobile terminal, thereby ensuring the linearity of the power amplifier. Thus, the method for reducing the power consumption of the mobile terminal can not only reduce the power consumption of the power amplifier but also ensure that the transmitting power of the mobile terminal after adjusting can meet the communication requirement of the mobile terminal by dynamically adjusting the current gain switching point.

Figure 5:
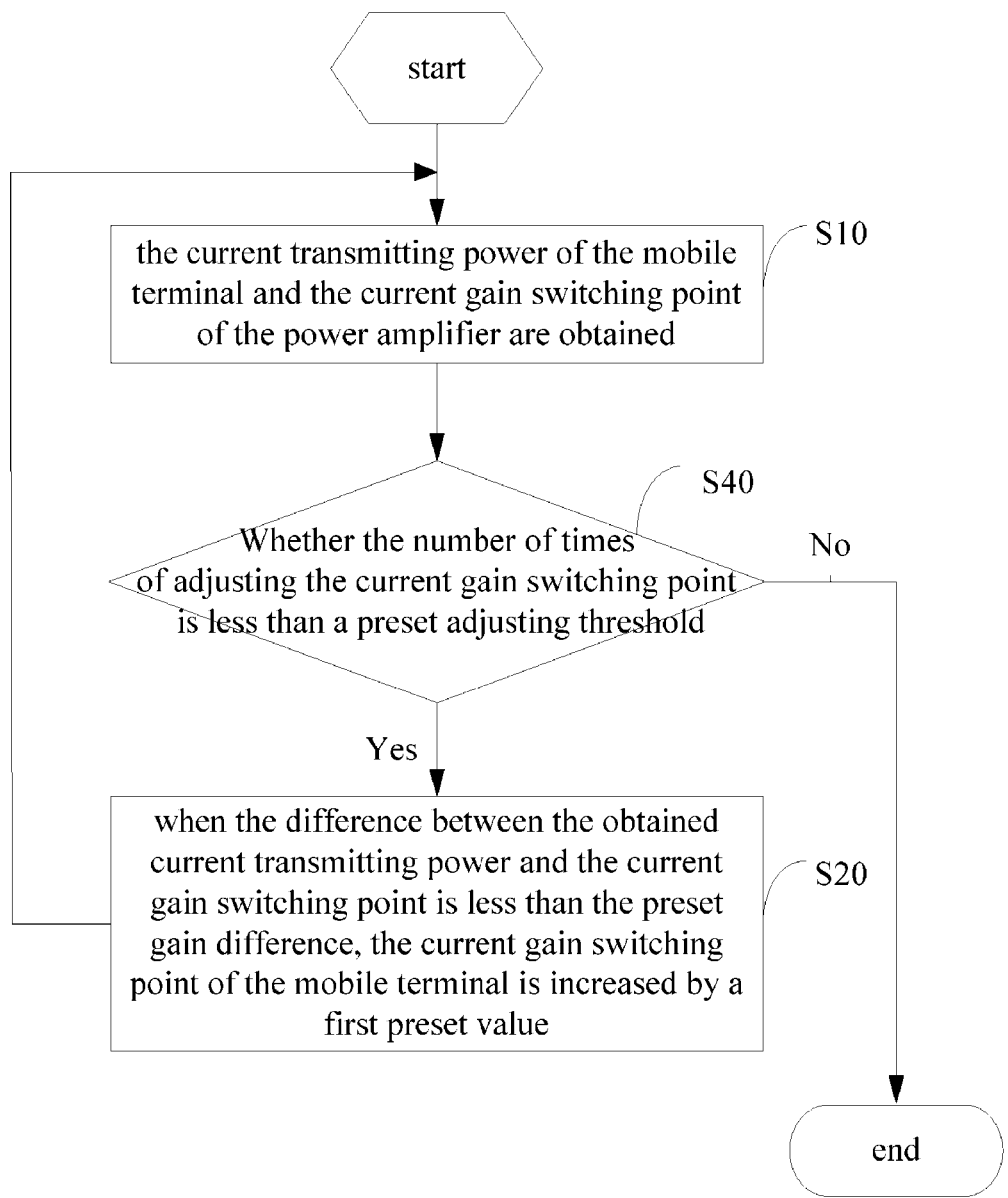
FIG. 5 shows a flowchart of a method for reducing power consumption of a mobile terminal according to a third embodiment of the disclosure.

Refer to FIG. 5, FIG. 5 shows a flowchart of a method for reducing power consumption of a mobile terminal according to a third embodiment of the disclosure.

Based on the above embodiment, the disclosure presents the third embodiment of the method for reducing the power consumption of the mobile terminal. Being different from the above embodiment, after Step 10, the present embodiment further includes the following steps:

Step 40: it is judged whether the number of times of adjusting the current gain switching point is less than a preset adjusting threshold; if the number of times of adjusting the current gain switching point is less than the preset adjusting threshold, continue to perform Step 20; if the number of times of adjusting the current gain switching point is greater than or equal to the preset adjusting threshold, the flow is ended; continue to perform Step 10 after performing Step 20 until the number of times of adjusting the current gain switching point is greater than or equal to the preset adjusting threshold.

For example, in the present embodiment, the preset adjusting threshold may be set as 5; after the number of times of adjusting the current gain switching point exceeds 5, the current gain switching point determined currently is the fixed switching point of the mobile terminal in the current working environment. Certainly, a condition may be set, that is, when the transmitting frequency of the mobile terminal fluctuates widely in a certain time range, it is indicated that the current gain switching point needs to be adjusted again, and then it is needed to determine the current gain switching point again.

By setting the preset adjusting threshold, the method for reducing the power consumption of a mobile terminal provided by the disclosure prevents the ping-pong effect, and avoids the situation in which the current gain switching point is adjusted repeatedly without end, so the method for reducing the power consumption of a mobile terminal is more reliable.

The disclosure also provides a device for reducing the power consumption of a mobile terminal.

Figure 6:
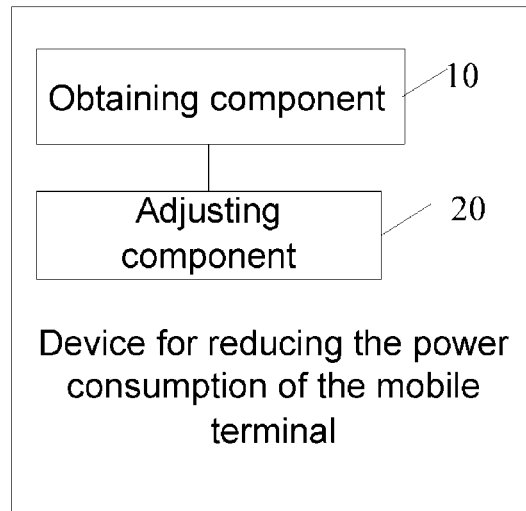
FIG. 6 shows a structure diagram of a device for reducing the power consumption of a mobile terminal according to a first embodiment of the disclosure.

Refer to FIG. 6, FIG. 6 shows a structure diagram of a device for reducing power consumption of a mobile terminal according to a first embodiment of the disclosure.

An obtaining component 10 is configured to obtain current transmitting power of the mobile terminal and a current gain switching point of the power amplifier;

An adjusting component 20 is configured to, when a difference between the obtained current transmitting power and the current gain switching point is less than a preset gain difference, increase the current gain switching point of the mobile terminal by a first preset value.

The present embodiment is illustrated based on that the mobile terminal is a mobile phone, which is not limited by the disclosure. For the power amplifier of the mobile phone, an illustration is given based on that the power amplifier is set with three levels of gain. A gain interval of each level has a switching point; when the current transmitting power of the mobile terminal is greater than the gain switching point of the first level, the mobile terminal is at the second-level gain.

The calculation formula of the PAE of the power amplifier in the mobile phone is as follows:

$$PAE = \frac{P_{out} - P_{in}}{V_{cc} \times I_{cc}} 100\%$$

where $P_{in}$ is the input power of the power amplifier in the mobile phone, $P_{out}$ is the output power of the power amplifier in the mobile phone, $V_{cc}$ is the power supply voltage of the power amplifier in the mobile phone, and $I_{cc}$ is the consumed current of the power amplifier in the mobile phone.

It can be seen from the above formula that when the input power and $P_{in}$ and the output power $P_{out}$ (i.e. the current transmitting power) of the power amplifier and the power supply voltage $V_{cc}$ of the mobile phone are fixed, the higher the PAE, the lower the direct current consumption $I_{cc}$ of the mobile phone, and the lower the power consumption of the power amplifier.

The current power amplifier of the mobile phone is generally set with three levels of gain, wherein the switching point between the first-level gain and the second-level gain is set as R1, and the switching point between the second-level gain and the third-level gain is set as R2. If the current transmitting power of the mobile phone is greater than R1, then the mobile phone is at the second-level gain. The switching points R1 and R2 of the mobile phone in related art are fixed.

For a power amplifier, the PAE of the tail end of the first-level gain is higher than the PAE of the beginning end of the second-level gain by 20%-30% (similarly, the PAE of the tail end of the second-level gain is higher than the PAE of the beginning end of the second-level gain), so, for the mobile phone, when the current transmitting power is close to the switching point R1 between the first-level gain and the second-level gain, if the mobile phone is controlled to use the first-level gain, then the PAE of the mobile phone is improved, that is, the power consumption of the power amplifier is reduced.

Specifically, in the present embodiment, the preset gain difference is preferably 1 dBm, and the first preset value is preferably 0.3 dBm. If the difference between the obtained current transmitting power of the mobile terminal and the current gain switching point is less than the preset gain difference, it is indicated that the current transmitting power of the mobile terminal is very close to the current gain switching point of the power amplifier, and then the current gain switching point is adjusted. In addition, note that, an initial gain switching point (namely the current gain switching point) is set before the mobile phone leaves the factory; then, it is decided, according to the environment where the mobile phone is, whether the gain switching point is adjusted.

The present embodiment is illustrated based on that the current transmitting power of the mobile phone is close to the switching point R1 between the first-level gain and the second-level gain.

The current transmitting power of the mobile phone is set as P; there are two cases of the present embodiment.

When R1−1≤P≤R1, it is indicated that the mobile phone is at the first-level gain currently (specifically at the tail end of the first-level gain), at this point, if the current transmitting power of the mobile phone is increased slightly, the mobile phone will be at the second-level gain, and the PAE of the beginning end of the second-level gain is lower than that of the tail end of the first-level gain, so the R1 is increased, for example, it can be increased by 0.3 dBm to ensure that the mobile phone can still be in the first-level gain stably in a short period of time, thereby improving the PAE.

When R1≤P≤R2, it is indicated that the mobile phone is at the second-level gain currently (specifically at the beginning end of the first-level gain), and the PAE of the beginning end of the second-level gain is lower than that of the tail end of the first-level gain, so the R1 is improved to make the mobile phone in the first-level gain, thereby improving the PAE.

In the device for reducing the power consumption of a mobile terminal provided by the present embodiment, the adjusting component 20 is configured to, when the difference between the obtained current transmitting power and the current gain switching point is less than the preset gain difference, increase the current gain switching point of the mobile terminal by a first preset value, so that the low-medium gain working range of the power amplifier of the mobile terminal is extended, and the PAE is improved, thereby reducing the power consumption of the power amplifier.

A lot of experimental results show that after the low-medium gain switching point of the power amplifier is dynamically adjusted, the current is saved by at least more than 60 mA compared with the case that the power amplifier uses the fixed switching point. In some cases, especially when the fixed switching point of the power amplifier is set unreasonably, the method presented in the disclosure may save, by setting the reasonable switching point, up to about 100 mA current.

Furthermore, the adjusting component 20 is further configured to calculate the communication parameter of the mobile terminal according to the current gain switching point increased, and when the communication parameter of the mobile terminal does not meet the communication requirement of the mobile terminal, decrease the current gain switching point by a second preset value.

Specifically, when the mobile terminal adjusts the current gain switching point, there are two cases, one of which is that the mobile terminal is at the gain level which is lower than the current gain switching point, and the other of which is that the mobile terminal is at the gain level which is higher than the current gain switching point.

The first case is that: the adjusting component 20 is specifically configured to, when the mobile terminal is at the gain level which is lower than the current gain switching point, and it is figured out, according to the current transmitting power, that the communication parameter of the mobile terminal meets the communication requirement of the mobile terminal currently, increase the current transmitting power by a third preset value, calculate the communication parameter of the mobile terminal according to the current transmitting power increased, and judge whether the communication parameter of the mobile terminal meets the communication requirement of the mobile terminal; the adjusting component is specifically configured to, if the communication parameter of the mobile terminal does not meet the communication requirement of the mobile terminal, decrease the current gain switching point by a second preset value, and continue to calculate the communication parameter of the mobile terminal according to the current transmitting power increased until the communication parameter of the mobile terminal meets the communication requirement of the mobile terminal, and if the communication parameter of the mobile terminal meets the communication requirement of the mobile terminal, increase the current transmitting power by a third preset value while increasing the current gain switching point of the mobile terminal by a first preset value; the adjusting component is specifically configured to, when the current transmitting power reduced is less than the current gain switching point, continue to calculate the communication parameter of the mobile terminal according to the current transmitting power increased until the current transmitting power increased is greater than or equal to the current gain switching point.

The present embodiment is specifically illustrated based on that the second preset value is 0.2 dBm, and the third preset value is 0.5 dBm.

If the mobile terminal is at the gain level which is lower than the current gain switching point, when the R1 is the current gain switching point, and the mobile terminal is at the first-level gain, the ACLR or the ACPR is calculated according to the current transmitting power P; if the ACLR or the ACPR meets the requirement of the 3GPP, the current gain switching point R1 is adjusted to be increased by 0.3 dBm while increasing the current transmitting power by 0.5 dBm as the step size; note that, during adjusting, it is required that the R1 is greater than the P, or else, the loop is stopped, and the current gain switching point and the current transmitting power are not increased. After the current gain switching point is adjusted, it is needed to determine whether the current gain switching point adjusted is appropriate, at this point, the ACLR and the ACPR are calculated according to the updated current transmitting power P; if the ACLR or the ACPR does not meet the requirement of the 3GPP, it is indicated that the current gain switching point is set too high, then the current gain switching point R1 is decreased by 0.2 dBm as the step size; after decreasing, it is needed to judge again whether the ACLR or the ACPR meets the requirement of the 3GPP, so as to determine whether the reduced current gain switching point R1 is appropriate; if the ACLR or the ACPR does not meet the requirement of the 3GPP, the current gain switching point R1 is decreased again by 0.2 dBm as the step size until the ACLR or the ACPR meets the requirement of the 3GPP.

The second case is that: the adjusting component 20 is specifically configured to, when the mobile terminal is at the gain level which is higher than the current gain switching point, and it is figured out, according to the current transmitting power, that the communication parameter of the mobile terminal meets the communication requirement of the mobile terminal currently, reduce the current transmitting power by a fourth preset value, calculate the communication parameter of the mobile terminal according to the current transmitting power reduced, and judge whether the communication parameter of the mobile terminal meets the communication requirement of the mobile terminal; the adjusting component is specifically configured to, if the communication parameter of the mobile terminal does not meet the communication requirement of the mobile terminal, decrease the current gain switching point by a fifth preset value, and calculate the communication parameter of the mobile terminal according to the current transmitting power reduced until the communication parameter of the mobile terminal meets the communication requirement of the mobile terminal, and if the communication parameter of the mobile terminal meets the communication requirement of the mobile terminal, reduce the current transmitting power by a fourth preset value while increasing the current gain switching point of the mobile terminal by a first preset value; the adjusting component is specifically configured to, when the current transmitting power reduced is greater than the current gain switching point, calculate the communication parameter of the mobile terminal according to the current transmitting power reduced until the current transmitting power increased is less than or equal to the current gain switching point.

If the mobile terminal is at the gain level which is higher than the current gain switching point R1, and R1<P<R1+1 dBm, it is indicated that the mobile terminal is at the beginning end of the second-level gain, at this point, the ACLR or the ACPR is calculated according to the current transmitting power P; if the ACLR or the ACPR meets the requirement of the 3GPP, the current gain switching point R1 is adjusted to be increased by 0.3 dBm while reducing the current transmitting power by 0.5 dBm as the step size; note that, during adjusting, it is required that the R1 is less than the P, or else, the loop is stopped. After the current gain switching point is adjusted, it is needed to determine whether the current gain switching point adjusted is appropriate, at this point, the ACLR and the ACPR are calculated according to the current transmitting power updated P; if the ACLR or the ACPR does not meet the requirement of the 3GPP, it is indicated that the current gain switching point is set too high, then the current gain switching point R1 is decreased by 0.2 dBm as the step size; after decreasing, it is judged again whether the ACLR or the ACPR meets the requirement of the 3GPP, so as to determine whether the current gain switching point R1 reduced is appropriate; if the ACLR or the ACPR does not meet the requirement of the 3GPP, the current gain switching point R1 is decreased again by 0.2 dBm as the step size until the ACLR or the ACPR meets the requirement of the 3GPP.

In the device for reducing the power consumption of the mobile terminal provided by the present embodiment, when the communication parameter of the mobile terminal does not meet the communication requirement of the mobile terminal, the current gain switching point is decreased by a second preset value, and it is ensured that the degree of adjusting the gain switching point is appropriate, so as to meet the communication requirement of the mobile terminal, thereby ensuring the linearity of the power amplifier. Thus, the device for reducing the power consumption of the mobile terminal can not only reduce the power consumption of the power amplifier but also ensure that the transmitting power of the mobile terminal after adjusting can meet the communication requirement of the mobile terminal by dynamically adjusting the current gain switching point.

Figure 7:
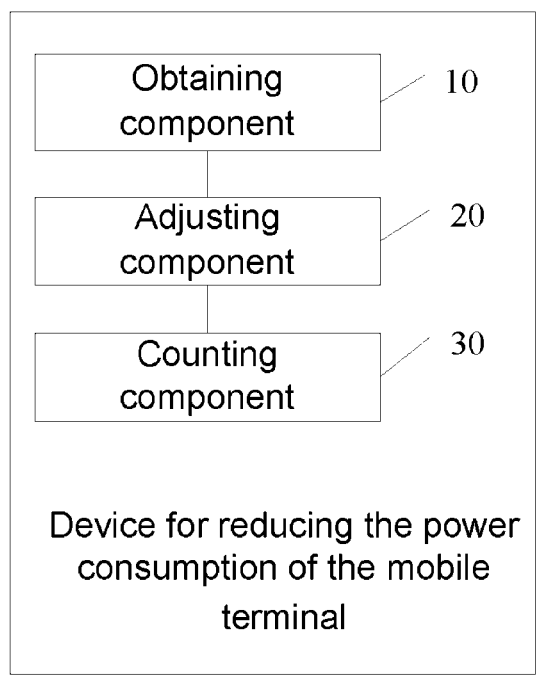
FIG. 7 shows a structure diagram of a device for reducing the power consumption of a mobile terminal according to a second embodiment of the disclosure.

Refer to FIG. 7, FIG. 7 shows a structure diagram of a second embodiment of a device for reducing power consumption of a mobile terminal according to the disclosure.

The disclosure presents the second embodiment of the device for reducing the power consumption of the mobile terminal. In the present embodiment, the device for reducing the power consumption of the mobile terminal further includes:

a counting component 30 configured to count the number of times of adjusting the current gain switching point;

an adjusting component 20 is further configured to, when the number of times of adjusting the current gain switching point is less than the preset adjusting threshold, obtain the current transmitting power of the mobile terminal and the current gain switching point of the power amplifier.

The counting component 30 of the device for reducing the power consumption of the mobile terminal provided by the disclosure counts the number of times of adjusting the current gain switching point, thereby preventing the ping-pong effect, and avoiding the situation in which the current gain switching point is adjusted repeatedly without end.

The above is only the preferred embodiments of the disclosure and not intended to limit the scope of the claims of the disclosure; any equivalent replacements of structure made based on contents of the specification and accompanying drawings of the disclosure, or direct or indirect application of the equivalent replacements in other related technical fields shall fall within the scope of the claims of the disclosure.

INDUSTRIAL APPLICABILITY

As described above, the method and device for reducing the power consumption of the mobile terminal provided by the disclosure have the following beneficial effects: in the method for reducing the power consumption of the mobile terminal provided by the disclosure, when the difference between the obtained current transmitting power and the current gain switching point is less than the preset gain difference, the current gain switching point of the mobile terminal is increased by a first preset value, so that the low-medium gain working range of the power amplifier of the mobile terminal is extended, and the PAE is improved, thereby reducing the power consumption of the power amplifier.

What is claimed is:

1. A method for reducing power consumption of a mobile terminal, comprising:
   A: obtaining current transmitting power of the mobile terminal and a current gain switching point of a power amplifier; and
   B: when a difference between the obtained current transmitting power and the current gain switching point is less than a preset gain difference, increasing the current gain switching point of the mobile terminal by a first preset value;
   wherein after the Step A, the method further comprises:
   D: when the difference between the obtained current transmitting power and the current gain switching point is less than the preset gain difference, and the number of times of adjusting the current transmitting power is less than a preset adjusting threshold, increasing the current gain switching point of the mobile terminal by the first preset value, and continuing to perform the Step A until the number of times of adjusting the current transmitting power is greater than or equal to the preset adjusting threshold.

2. The method for reducing the power consumption of the mobile terminal according to claim 1, wherein after Step B, the method further comprises:
   C: calculating a communication parameter of the mobile terminal according to the current gain switching point increased, and when the communication parameter of the mobile terminal does not meet a communication requirement of the mobile terminal, decreasing the current gain switching point by a second preset value.

3. The method for reducing the power consumption of the mobile terminal according to claim 2, wherein the Step C specifically comprises:
   C11: when the mobile terminal is at a gain level which is lower than the current gain switching point, and it is figured out, according to the current transmitting power, that the communication parameter of the mobile terminal meets the communication requirement of the mobile terminal currently, increasing the current transmitting power by a third preset value;
   C12: calculating the communication parameter of the mobile terminal according to the current transmitting power increased;
   C13: judging whether the communication parameter of the mobile terminal meets the communication requirement of the mobile terminal;
   C14: based on that the communication parameter of the mobile terminal does not meet the communication requirement of the mobile terminal, then decreasing the current gain switching point by a second preset value, and continuing to perform Step C12 until the communication parameter of the mobile terminal meets the communication requirement of the mobile terminal;
   C15: based on that the communication parameter of the mobile terminal meets the communication requirement of the mobile terminal, then increasing the current transmitting power by the third preset value while increasing the current gain switching point of the mobile terminal by the first preset value; and
   C16: when the current transmitting power increased is less than the current gain switching point, continuing to perform Step C12 until the current transmitting power increased is greater than or equal to the current gain switching point.

4. The method for reducing the power consumption of the mobile terminal according to claim 3, wherein Step C specifically comprises:
   C21: when the mobile terminal is at a gain level which is higher than the current gain switching point, and it is figured out, according to the current transmitting power, that the communication parameter of the mobile terminal meets the communication requirement of the mobile terminal currently, reducing the current transmitting power by a fourth preset value;
   C22: calculating the communication parameter of the mobile terminal according to the current transmitting power reduced;
   C23: judging whether the communication parameter of the mobile terminal meets the communication requirement of the mobile terminal;
   C24: based on that the communication parameter of the mobile terminal does not meet the communication requirement of the mobile terminal, then decreasing the current gain switching point by a fifth preset value, and continuing to perform the Step C22 until the communication parameter of the mobile terminal meets the communication requirement of the mobile terminal;
   C25: based on that the communication parameter of the mobile terminal meets the communication requirement of the mobile terminal, then reducing the current transmitting power by the fourth preset value while increasing the current gain switching point of the mobile terminal by the first preset value; and
   C26: when the current transmitting power reduced is greater than the current gain switching point, continuing to perform the Step C22 until the current transmitting power reduced is less than or equal to the current gain switching point.

5. A device for reducing power consumption of a mobile terminal, comprising:
   an obtaining component configured to obtain current transmitting power of the mobile terminal and a current gain switching point of a power amplifier; and
   an adjusting component configured to, when the difference between the obtained current transmitting power and the current gain switching point is less than a preset gain difference, increase the current gain switching point of the mobile terminal by a first preset value;
   a counting component, which is configured to count the number of times of adjusting the current gain switching point;
   the adjusting component is further configured to, when the number of times of adjusting the current gain switching point is less than a preset adjusting threshold, continuing to obtain the current transmitting power of the mobile terminal and the current gain switching point of the power amplifier until the number of times of adjusting the current transmitting power is greater than or equal to the preset adjusting threshold.

6. The device for reducing the power consumption of the mobile terminal according to claim 5, wherein the adjusting component is further configured to calculate a communication parameter of the mobile terminal according to the current gain switching point increased, and when the communication parameter of the mobile terminal does not meet the communication requirement of the mobile terminal, decrease the current gain switching point by a second preset value.

7. The device for reducing the power consumption of the mobile terminal according to claim 6, wherein the adjusting component is specifically configured to, when the mobile terminal is at a gain level which is lower than the current gain switching point, and it is figured out, according to the current transmitting power, that the communication parameter of the mobile terminal meets the communication requirement of the mobile terminal currently, increase the current transmitting power by a third preset value, calculate the communication parameter of the mobile terminal according to the current transmitting power increased, and judge whether the communication parameter of the mobile terminal meets the communication requirement of the mobile terminal; the adjusting component is specifically configured to, based on that the communication parameter of the mobile terminal does not meet the communication requirement of the mobile terminal, decrease the current gain switching point by a second preset value, and continue to calculate the communication parameter of the mobile terminal according to the current transmitting power increased until the communication parameter of the mobile terminal meets the communication requirement of the mobile terminal, and based on that the communication parameter of the mobile terminal meets the communication requirement of the mobile terminal, increase the current transmitting power by a third preset value while increasing the current gain switching point of the mobile terminal by a first preset value; the adjusting component is specifically configured to, when the current transmitting power increased is less than the current gain switching point, continue to calculate the communication parameter of the mobile terminal according to the current transmitting power increased until the current transmitting power increased is greater than or equal to the current gain switching point.

8. The device for reducing the power consumption of the mobile terminal according to claim 6, wherein the adjusting component is specifically configured to, when the mobile terminal is at a gain level which is higher than the current gain switching point, and it is figured out, according to the current transmitting power, that the communication parameter of the mobile terminal meets the communication requirement of the mobile terminal currently, reduce the current transmitting power by a fourth preset value, calculate the communication parameter of the mobile terminal according to the current transmitting power reduced, and judge whether the communication parameter of the mobile terminal meets the communication requirement of the mobile terminal; the adjusting component is specifically configured to, if the communication parameter of the mobile terminal does not meet the communication requirement of the mobile terminal, decrease the current gain switching point by a fifth preset value, and calculate the communication parameter of the mobile terminal according to the current transmitting power reduced until the communication parameter of the mobile terminal meets the communication requirement of the mobile terminal, and if the communication parameter of the mobile terminal meets the communication requirement of the mobile terminal, reduce the current transmitting power by a fourth preset value while increasing the current gain switching point of the mobile terminal by a first preset value; the adjusting component is specifically configured to, when the current transmitting power reduced is greater than the current gain switching point, calculate the communication parameter of the mobile terminal according to the current transmitting power reduced until the current transmitting power reduced is less than or equal to the current gain switching point.

* * * * *